United States Patent [19]

Tai

[11] Patent Number: 5,450,308

[45] Date of Patent: Sep. 12, 1995

[54] GATE POWER SUPPLY CIRCUIT

[75] Inventor: Hiromichi Tai, Tokyo, Japan

[73] Assignee: Kabushiki Kaisha Toshiba, Kawasaki, Japan

[21] Appl. No.: 200,685

[22] Filed: Feb. 23, 1994

[51] Int. Cl.[6] .................... H02H 7/122; H02M 7/515
[52] U.S. Cl. ......................................... 363/57; 363/96; 327/440
[58] Field of Search ................ 363/54, 57, 85, 86, 363/96; 327/440, 442, 443

[56] References Cited

U.S. PATENT DOCUMENTS

| | | |
|---|---|---|
| 3,928,776 | 12/1975 | Thiele . |
| 4,231,083 | 10/1980 | Matsuda et al. ............... 363/57 |
| 4,509,069 | 4/1985 | Stoisiek ............................ 327/440 |
| 4,678,932 | 7/1987 | Tanaka et al. ................. 327/440 |
| 4,924,370 | 5/1990 | Toelle ............................... 363/57 |

FOREIGN PATENT DOCUMENTS 0573836 12/1993 European Pat. Off. .

Primary Examiner—Peter S. Wong
Attorney, Agent, or Firm—Oblon, Spivak, McClelland, Maier & Neustadt

[57] ABSTRACT

A gate power supply circuit including a switching device and a gate drive circuit connected to the switching device for generating a gate signal to be supplied to a gate of the switching device. The gate power supply circuit further includes a first series circuit of a first capacitor and an inductor, connected in parallel with the switching device, and a second series circuit of a first diode and a second capacitor, connected in parallel with the inductor. The gate drive circuit is connected to the second capacitor to receive energy stored in the second capacitor as power source for the gate drive circuit.

11 Claims, 6 Drawing Sheets

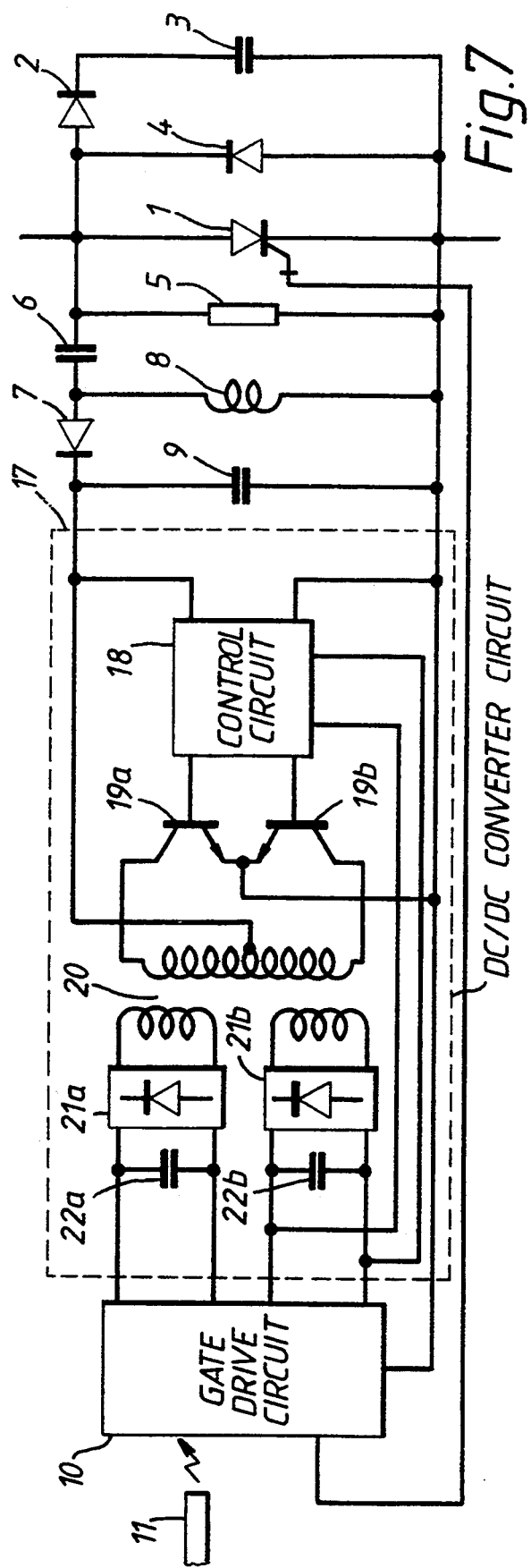
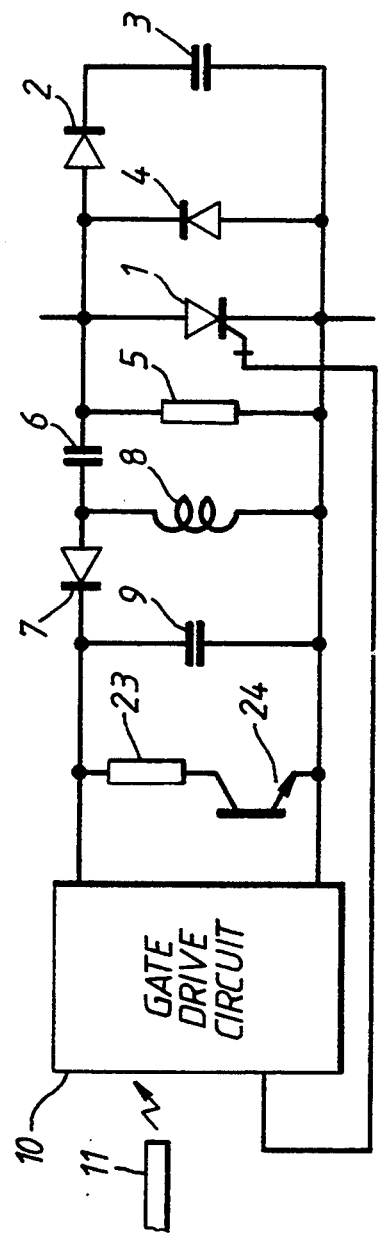
Fig.7
Fig.8

GATE POWER SUPPLY CIRCUIT

BACKGROUND OF THE INVENTION

1. Field of the Invention

This invention relates to a gate power supply circuit, and more particularly to a gate power supply circuit that supplies gate power to the gate drive circuit for a self-turn-off device from a main circuit, utilizing the switching action of a self-turn-off device etc.

2. Description of the Related Art

By employing self-turn-off devices in a power converter such as an inverter, the benefits are obtained of better suppression of source side and load side harmonics than hitherto, improvement of the power source power factor, and device miniaturization, etc. Hitherto, it was impossible to obtain self-turn-off devices suited for high voltage and larger current use. Recently however, it has become possible to manufacture self-turn-off devices typified by GTOs suited for high voltage and large current use. Application of self-turn-off devices to the high power field has therefore become common.

When applying self-turn-off devices such as GTOs to high voltage applications, the problem of the drive power source of the gate drive circuit of the self-turn-off device cannot be neglected. This problem is particularly severe in the case of GTOs which are switching devices mainly employed in the high power field. The reason for this is that a GTO is a current-controlled device, yet the degree of current amplification on turn-off is small, so, on turn-off, a very large current the amplitude of which is about one third through one fifth of that of the main circuit current, must be supplied to the gate of the GTO. Furthermore, even when the GTO is ON, current to the gate must be continued in order to reduce conduction loss. The power consumption of the gate drive circuit of a GTO is therefore at least 100 W per GTO, although this does vary depending on the type of GTO.

Since the gate drive circuit of a GTO is directly connected to the cathode and gate of the GTO that is being driven, it is electrically at the same potential as the cathode of the GTO that is being driven. When GTOs are connected in series, the gate drive circuit of each GTO is at a respectively different potential, so the power sources of the respective gate drive circuits must be at respectively different potentials. This means that the power sources of the gate drive circuits of the GTOs must be mutually insulated for each respective GTO.

An example of a conventionally used GTO gate power supply circuit is shown in FIG. 12. FIG. 12 shows a single GTO of a plurality of GTOs constituting a power converter and the associated snubber circuit and gate drive circuit.

In FIG. 12, a GTO 1 is the main switching device. A snubber diode 2 and a snubber capacitor 3 constitute a snubber circuit for suppressing the rate of voltage rise when GTO 1 is turned OFF, and suppress GTO loss on turn-off. A diode 4 is a free-wheeling diode that provides a current path for the main circuit current in regeneration mode. A resistor 5 is a DC balance resistor that performs the action of balancing the DC voltages apportioned to each GTO when a large number of GTOs are connected in series, so that they are not affected by the slight variations of the characteristics of each GTO.

The gate of GTO 1 is driven by a gate drive circuit 10. The ON/OFF signal of the gate is transmitted as an optical signal by an optical fiber 11 and is converted to an electrical signal by a photoreceptor module, not shown, in gate drive circuit 10. Since an optical signal is employed, the ON/OFF gate signals are automatically insulated for each GTO 1. Regarding the power source of gate drive circuit 10, this can be obtained by using a rectifier 12 to produce DC power by rectifying the high frequency (such as 20 kHz) AC power supplied from a high frequency AC power source 14 through an isolating transformer 13. High frequency AC power source 14 is located in a low potential zone and is supplied in common to each GTO; the difference in potential between GTOs 1 is insulated by means of isolating transformer 13 corresponding to each respective GTO 1.

However, there are considerable problems in applying the prior art to power converters in which a large number of GTOs are connected in series and the DC bus voltage exceeds a few tens of kV. This is because a large number of isolating transformers capable of withstanding a high voltage of a few tens of kV to be isolated across their poles and capable of insulating the high voltage are required in order to achieve delivery of high frequency AC power through isolating transformers 13 from the low potential zone. Not only do such isolating transformers require a large amount of space, but in addition they are enormously expensive. There were therefore problems on grounds of space and cost in applying the prior art to high voltage application, such as power converters, in which a large number of GTOs were connected in series.

SUMMARY OF THE INVENTION

Accordingly, one object of this invention is to provide a gate power supply circuit which can dispense with an isolating transformer and enables miniaturization and cost reduction of a power converter constructed using self-turn-off devices.

These and other objects can be achieved by providing a gate power supply circuit including a switching device and a gate drive circuit connected to the switching device for generating a gate signal to be supplied to a gate of the switching device. The gate power supply circuit further includes a first series circuit of a first capacitor and an inductor, connected in parallel with the switching device, and a second series circuit of a first diode and a second capacitor, connected in parallel with the inductor. The gate drive circuit is connected to the second capacitor to receive energy stored in the second capacitor as power source for the gate drive circuit.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 7 is a layout diagram showing a gate power supply circuit according to a fourth embodiment of this invention;

FIG. 8 is a layout diagram showing a gate power supply circuit according to a fifth embodiment of this invention;

DETAILED DESCRIPTION OF THE PREFERRED EMBODIMENTS

Figure 1:
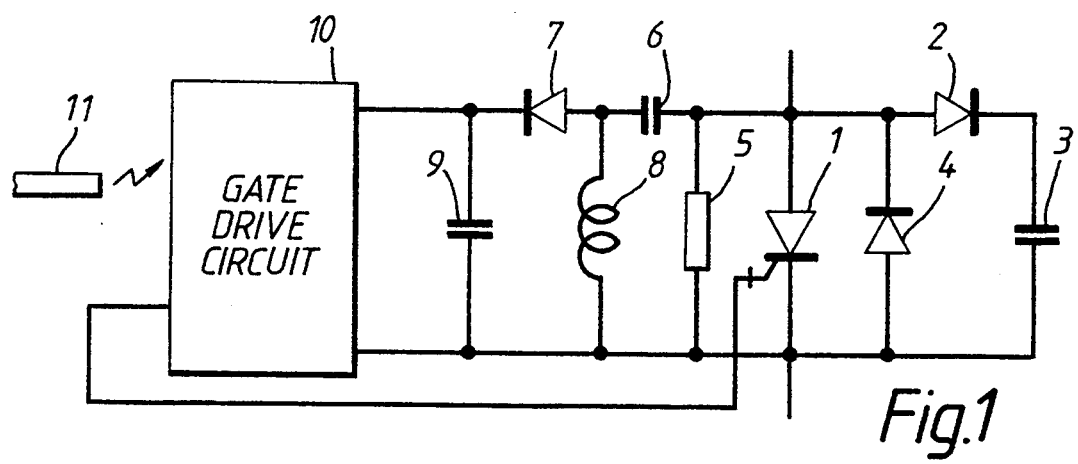
FIG. 1 is a layout diagram showing a gate power supply circuit according to a first embodiment of this invention.

Referring now to the drawings, wherein like reference numerals designate identical or corresponding parts throughout the several views, the embodiments of this invention will be described below.

FIG. 1 is a layout diagram showing a gate power supply circuit according to a first embodiment of this invention. In this Figure, 1 is a self-turn-off device (hereinbelow referred to as GTO 1) of the main circuit. A snubber circuit consisting of the series circuit of a snubber diode 2 and snubber capacitor 3, free-wheeling diode 4 and DC balance resistor 5 are connected in parallel with GTO 1.

One terminal of a first capacitor 6 is connected to the anode of GTO 1 and the other terminal of first capacitor 6 is connected to the anode of a first diode 7. One terminal of an inductor 8 is connected to the anode of first diode 7 and the other terminal of inductor 8 is connected to the cathode of GTO 1. One terminal of a second capacitor 9 is connected to the cathode of first diode 7 and the other terminal of second capacitor 9 is connected to the cathode of GTO 1. On the switching operation of GTO 1, the energy stored in second capacitor 9 is supplied to a gate drive circuit 10. Gate drive circuit 10 generates a gate signal for GTO 1 based on an optical signal supplied through an optical fiber 11.

Figure 2:
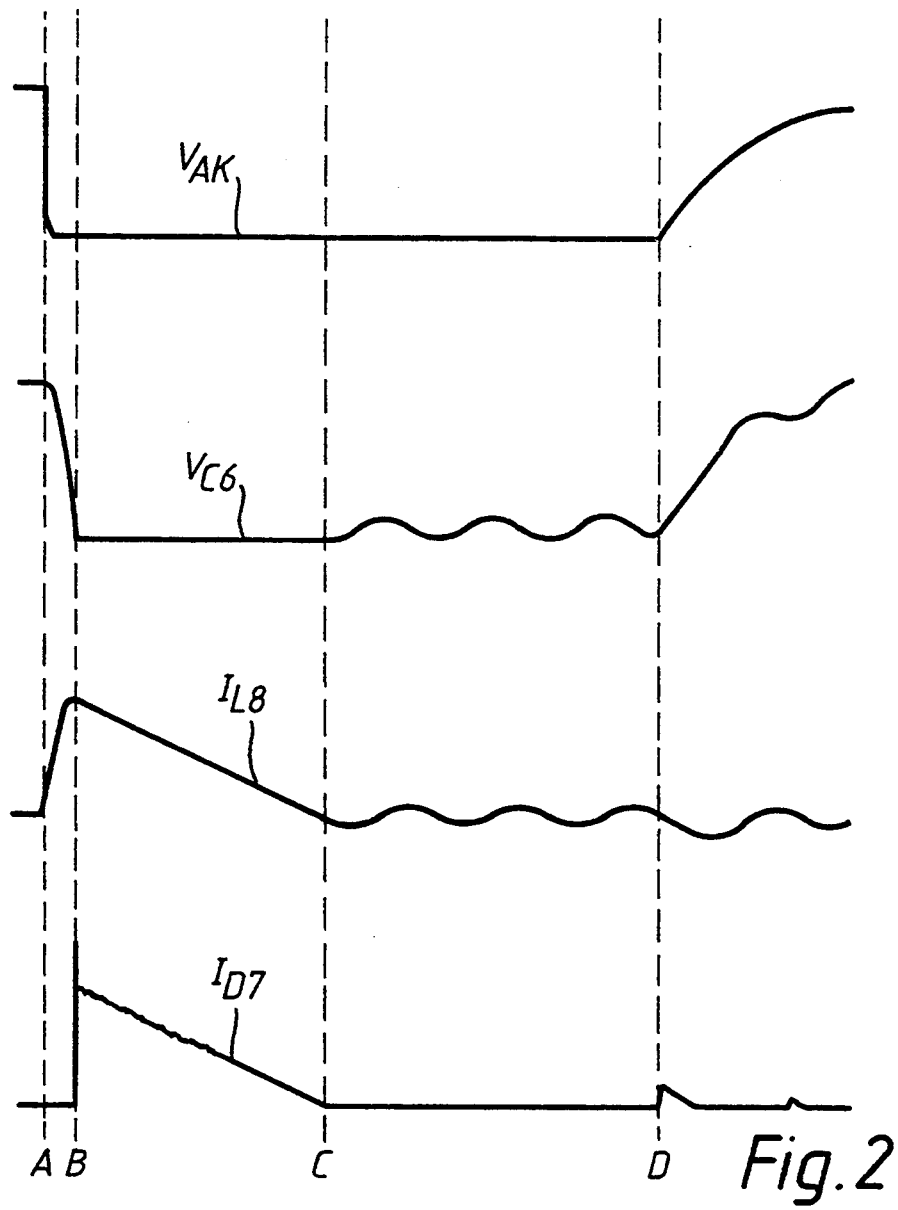
FIG. 2 is an operating waveform diagram given in explanation of the operation of the gate power supply circuit of FIG. 1.

The operation of the gate power supply circuit constructed as shown in FIG. 1 will now be described with reference to FIG. 2. In FIG. 2, VAK is a voltage between the anode and cathode of GTO 1, VC6 is a voltage of first capacitor 6, IL8 is a current flowing through inductor 8 and ID 7 is a current flowing through first diode 7.

During when GTO 1 is OFF, first capacitor 6 is charged through first diode 7 and second capacitor 9 to a voltage approximate to the DC voltage apportioned to GTO 1. At time point A, GTO 1 is turned ON. From time point A voltage VAK of GTO 1 drops. Simultaneously, the charge of first capacitor 6 is discharged by the loop (first capacitor 6→GTO 1→inductor 8→first capacitor 6), and the voltage VC6 of first capacitor 6 starts to drop. Then, discharge of first capacitor 6 terminates. At this time, voltage VC6 of first capacitor becomes zero and current IL8 of inductor 8 becomes to be a maximum value. Then, current IL8 of inductor 8 charges first capacitor 6 in the reverse direction. At time point B, voltage VC6 of first capacitor 6 becomes equal to the voltage of second capacitor 9, first diode 7 starts to conduct and current ID7 of first diode 7 starts to rise. When first diode 7 conducts, current IL8 of inductor 8 flows separately to second capacitor 9 and first capacitor 6. The ratio of the current of second capacitor 9 to that of first capacitor 6 is equal to the ratio of the capacitance of second capacitor 9 to that of first capacitor 6. The capacitance of second capacitor 9 is set to be greatly larger than that of first capacitor 6 so as to suppress the fluctuation of the voltage supplied to gate drive circuit 10, so that current IL8 of inductor 8 flows mostly to second capacitor 9. Namely, after time point B, most of the energy stored in inductor 8 is transferred to second capacitor 9. At time point C, current ID7 flowing in first diode 7 becomes zero.

Figure 12:
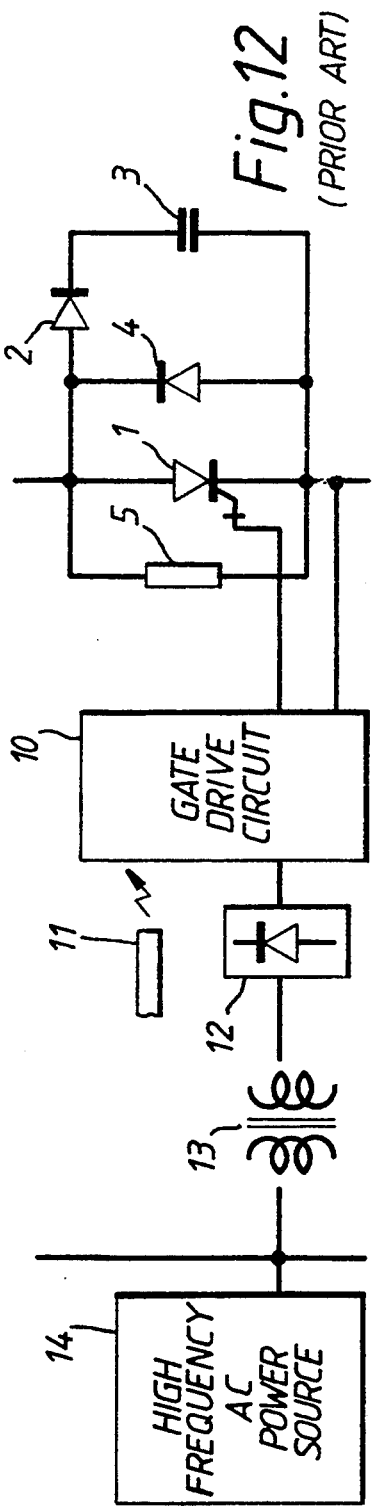
FIG. 12 is a layout diagram showing a prior art gate power supply circuit.

In this embodiment, the energy stored in second capacitor 9 is supplied to gate drive circuit 10, so that an isolating transformer 13 of high withstand voltage that is necessary in the prior art shown in FIG. 12 can be omitted.

At time point C, first capacitor 6 is charged in the reverse direction. After time point C, the energy stored in first capacitor 6 is exchanged between first capacitor 6 and inductor 8 in the oscillation manner. During the exchanges, the exchanged energy is gradually consumed due to conduction loss of GTO 1 and so on. The oscillations in voltage VC6 and current IL8 continue with attenuation till first capacitor 6 is charged again after GTO 1 is turned OFF at time point D.

The energy Eloss consumed in the form of conduction loss and so on is expressed as the following equation:

$$Eloss = C6 \cdot (VC9)^2 / 2,$$

where the capacitance of first capacitor 6 is C6 and the maximum value of the voltage of second capacitor 9 is VC9.

Usually as the value of voltage VC9, a low voltage is selected which is suitable for the power source voltage of gate drive circuit 10, for example a ten and a few volts. The energy EC6 stored in first capacitor 6 when first capacitor 6 is charged to DC apportioned voltage VD of GTO 1 is expressed as the following equation.

$$EC6 = C6 \cdot (VD)^2 / 2$$

Based on the two equations, the percentage of the energy can be obtained which is lost by charging first capacitor 6 in the reverse direction. In a typical case, where VD is 3,000 volts and VC9 is 15 volts, the percentage of the lost energy is:

$$\begin{aligned}(Eloss/EC6) \times 100 &= (VC9/VD)^2 \times 100 \\ &= (15/3,000)^2 \times 100 \\ &= 0.0025\%\end{aligned}$$

As described above, the energy loss is negligibly small, so that the energy loss will not practically become a problem.

Figure 3:
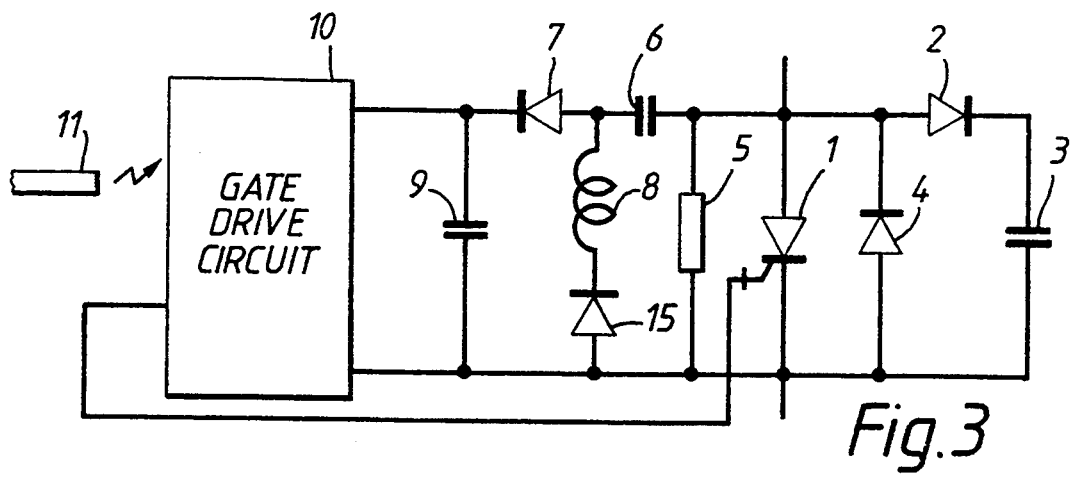
FIG. 3 is a layout diagram showing a gate power supply circuit according to a second embodiment of this invention.

But in specific applications, the oscillation current flowing between first capacitor 6 and inductor 8 after time point C may become a problem. FIG. 3 is a layout diagram showing a gate power supply circuit according to a second embodiment of this invention which is made in consideration of this problem. In this embodiment, a second diode 15 is further provided which is connected in series with inductor 8 in the first embodiment shown in FIG. 1.

Figure 4:
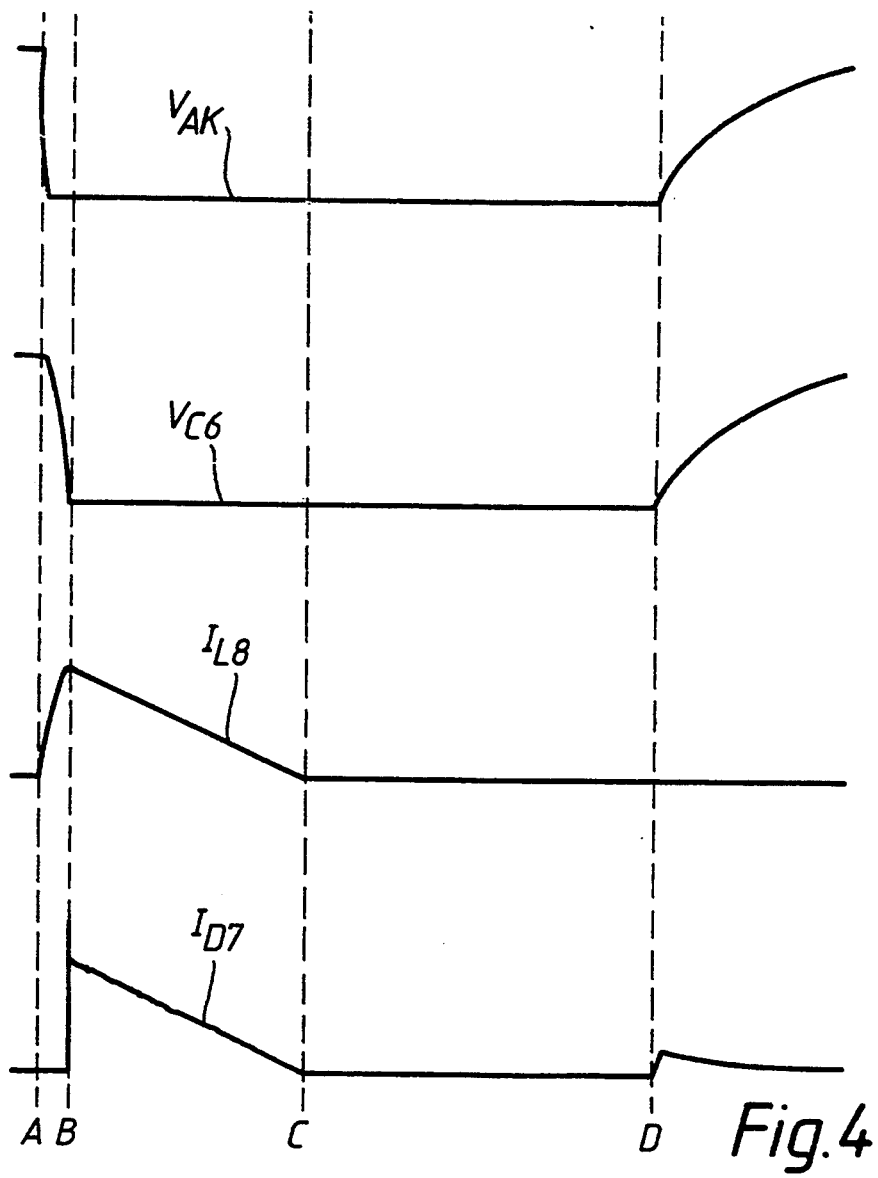
FIG. 4 is an operating waveform diagram given in explanation of the operation of the gate power supply circuit of FIG. 3.

The operation of the second embodiment shown in FIG. 3 will now be described with reference to FIG. 4. In FIG. 4, from time point A to time point C, the operation of the second embodiment is the same as that of the first embodiment. After time point C, the second embodiment operates differently from the first embodiment due to the action of second diode 15.

Namely, first capacitor 6 is changed in the reverse direction the same as in the first embodiment. The charge of first capacitor 6 is prevented from discharging to inductor 8 by second diode 15 connected in series with inductor 8. The charge of first capacitor which has been charged in the reverse direction is held, just as it is, till time point D when GTO 1 starts to turn OFF again. The oscillation current, therefore, will not flow between first capacitor 6 and inductor 8. After time point D, when the current having been flowing through GTO 1 is changed to flow through first capacitor 6, first diode 7 and second capacitor 9 so that first capacitor 6 is recharged, the charge of first capacitor 6 which is charged in the reverse direction flows to second capacitor 9.

As described above, the oscillation current will not flow between first capacitor 6 and inductor 8 in the second embodiment.

In the first embodiment, the maximum value of the voltage applied to inductor 8 is approximately equal to DC apportioned voltage VD which is apportioned to GTO 1. This can be explained as the following. The turn ON time of GTO 1 is about 10 μs, which is smaller than a time constant of the discharge circuit of first capacitor 6. Therefore, when turning ON of GTO 1 terminates, the voltage of first capacitor 6 keeps voltage VD, as it is, which has been charged during when GTO 1 is OFF. The voltage applied to inductor 8 is equal to the voltage which is subtracted the voltage of GTO 1 from that of first capacitor 6. When turning ON of GTO 1 terminates, the voltage of first capacitor 6 is applied, as it is, to inductor 8. The voltage applied to inductor 8 becomes to a maximum value when turning ON of GTO 1 terminates, which is approximately equal to DC apportioned voltage VD. Usually, the DC apportioned voltage VD is a high voltage, such as 3,000 volts. Inductor 8 which can withstand such a high voltage is essentially large in its size and cost.

Figure 5:
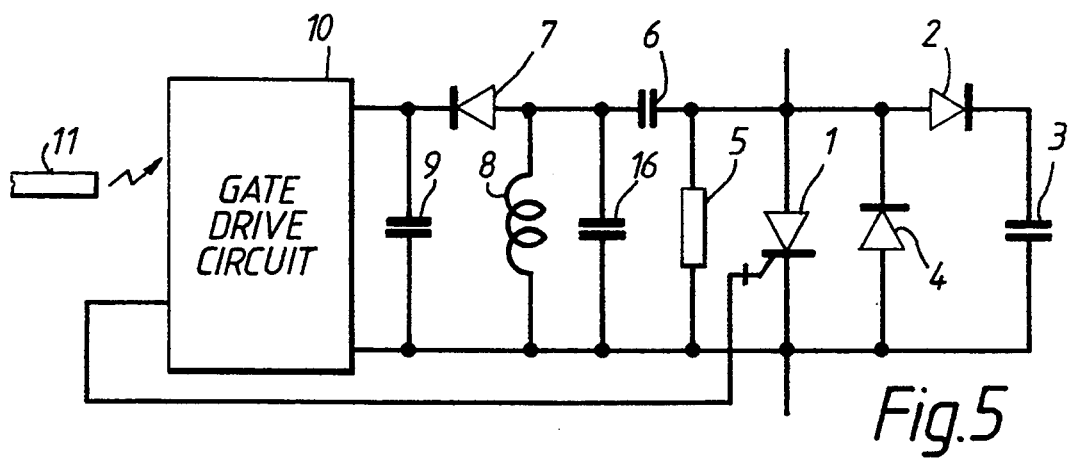
FIG. 5 is a layout diagram showing a gate power supply circuit according to a third embodiment of this invention.

Accordingly, a third embodiment of this invention is made in order to reduce the voltage applied to inductor 8. FIG. 5 is a layout diagram showing a gate power supply circuit according to a third embodiment of this invention. In this embodiment, a third capacitor 16 is further provided which is connected in parallel with inductor 8 in the first embodiment shown in FIG. 1.

Figure 6:
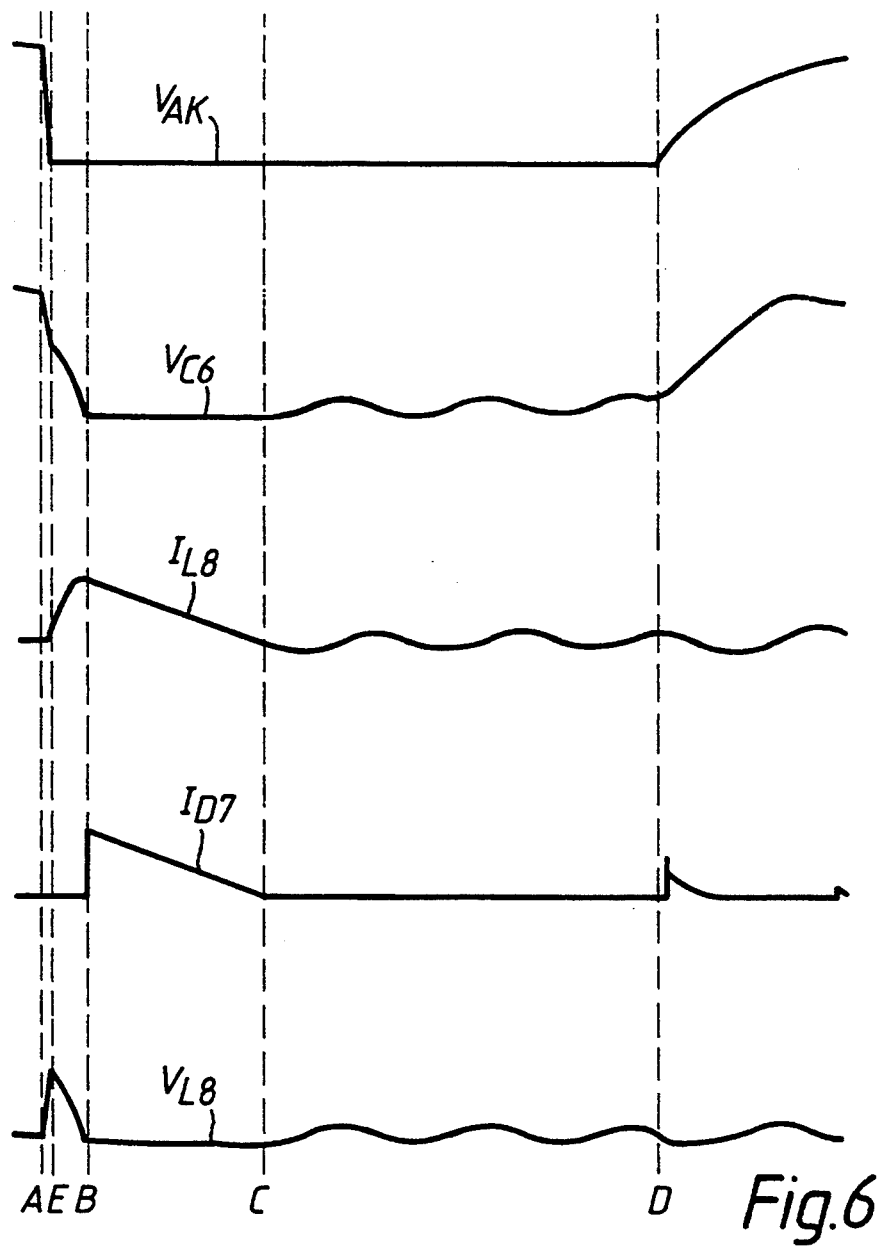
FIG. 6 is an operating waveform diagram given in explanation of the operation of the gate power supply circuit of FIG. 5.

The operation of the third embodiment shown in FIG. 5 will now be described with reference to FIG. 6. In FIG. 6 VL8 is a voltage of inductor 8. At time point A, GTO 1 starts to turn ON. At this time point A, first capacitor 6 is charged to apportioned voltage VD of GTO 1 and the charge of third capacitor 16 is zero. From time point A, voltage VAK which is a voltage between the anode and cathode of GTO 1 starts to fall. Along with this, the charge of first capacitor 6 is transferred to third capacitor 16 through GTO 1. The difference between the voltage of first capacitor 6 and that of third capacitor 16 is equal to voltage VAK of GTO 1. When voltage VAK of GTO 1 becomes to be approximately zero at time point E, the voltage of first capacitor 6 becomes equal to that of third capacitor 16 and also equal to voltage VL8 of inductor 8. From time point E, the charge of first capacitor 6 is discharged by flowing the current to inductor 8 through GTO 1, and the charge of third capacitor 16 is discharged directly through inductor 8 connected in parallel with third capacitor 16. At time point B, the discharge of first capacitor 6 and that of third capacitor 18 terminate simultaneously, and both the voltages of first capacitor 6 and third capacitor 16 become zero. At time point B, current IL8 of inductor 8 becomes to a maximum value. At time point B, both the voltages of first capacitor 6 and third capacitor 16 become equal to the voltage of second capacitor 9, and first diode 7 starts to conduct. When first diode 7 conducts, the current of inductor 8 flows separately to first capacitor 6, second capacitor 9 and third capacitor 16. In this state, the ratio in current among first capacitor 6, second capacitor 9 and third capacitor 16 becomes equal to the ratio in the capacitance among them. As the capacitance of second capacitor 9 is set to be greatly larger than those of first capacitor 6 and third capacitor 16 so as to suppress the fluctuation of the voltage supplied to gate drive circuit 10, current IL8 of inductor 8 flows mostly to second capacitor 9. Namely, after time point B, most of the energy stored in inductor 8 is transferred to second capacitor 9. At time point C, current ID7 flowing in first diode 7 becomes zero. At time point C, both first capacitor 6 and third capacitor 16 are charged in the reverse direction. After time point C, the energy stored in first capacitor 6 and third capacitor 16 is exchanged to inductor 8 in the oscillation manner. During exchanges, the exchanged energy is gradually consumed due to conduction loss of GTO 1 and so on. The oscillation continues with attenuation till first capacitor 6 is charged again after GTO 1 is turned OFF at time point D.

Hereinafter, how much the voltage of inductor 8 is reduced by adding third capacitor 16 will be explained. The maximum value of the voltage applied to inductor 8 is equal to a voltage VC16(E) of third capacitor 16 at time point E, which is calculated at the following.

At the time necessary for turning GTO 1 ON is extremely small, for example at most 10 μs, the effect of the current flowing in inductor 8 can be neglected. When the charge stored in first capacitor 6 is transferred, as it is, to third capacitor 16 and turning ON of GTO 1 is completed at time point E, it may be thought that the voltage of first capacitor 6 is equal to that of third capacitor 16. Accordingly, taking that the charge of first capacitor 6 at time point A is QC6(A), the charges of first capacitor 6 and third capacitor 16 are QC6(E) and QC16(E) at time point E, respectively, the following equation holds.

$$QC6(A) = QC6(E) + QC16(E).$$

Generally, the charge of a capacitor is a product of the capacitance thereof and the voltage thereof. Taking that the capacitance of third capacitor 16 is C16, the voltage of first capacitor 6 at time point A is DC apportioned voltage VD, the voltage of first capacitor 6 at time point E is VC6(E) and the voltage of third capacitor 16 at time point E is VC16(E), the following equation holds.

$$VD \cdot C6 = VC6(E) \cdot C6 + VC16(E) \cdot C16$$

As described before, the difference between the voltage of first capacitor 6 and that of third capacitor 16 is equal to the voltage of GTO 1. Considering that voltage VAK of GTO 1 at time point E is regarded as zero, $$VC6(E) = VC16(E).$$

The following equation holds based on the above-described two equations.

$$VC16(E) = [C6/(C16 + C6)] \cdot VD$$

Namely, comparing with the embodiment shown in FIG. 1, the maximum value of the voltage applied to inductor 8 is reduced to the voltage-divided value of third capacitor 16 and first capacitor 6 which is the value VD multiplied by C6/(C16+C6) in this embodiment. Taking that the capacitance of third capacitor 16 is equal to that of first capacitor 6, for example, the maximum value of the voltage applied to inductor 8 is reduced to be one half of the value in the embodiment of FIG. 1.

As described above, according to this embodiment, the voltage applied to inductor 8 can be reduced.

In the third embodiment, though the maximum voltage applied to inductor 8 can be reduced, energy efficiency will be reduced compared with the embodiment of FIG. 1. Total energy Etot(E) stored in first capacitor 6 and third capacitor 16 at time point E is expressed as the following.

$$\begin{aligned} Etot(E) &= (C6 \cdot VC6\ (E)^2/2) + (C16 \cdot VC16\ (E)^2/2) \\ &= (C6 \cdot VD^2)[C6/(C16 + C6)] \end{aligned}$$

Considering that the energy Etot(A) stored in first capacitor 6 at time point A is $$Etot(A) = (C6 \cdot VD^2/2),$$

it is found that at time point E, only a ratio [C6/(C16+C6)] of the original energy Etot(A) stored at time point A is left in first capacitor 6 and third capacitor 16. The other energy is lost in GTO 1. Comparing with total loss in power converter, this energy loss is very small. But from the standpoint of the increase in the loss of GTO 1, the effect due to the above-described increase in the energy loss is not negligible. This embodiment is, therefore, suitable for an application in which the maximum voltage applied to inductor 8 is to be reduced, whereas a little increase in the loss of GTO 1 is not a severe problem.

In the above-described embodiments, the voltage of second capacitor 9 is directly used for a power source voltage of gate drive circuit 10. Whereas, FIG. 7 is a layout diagram showing a gate power supply circuit according to a fourth embodiment of this invention, in which the voltage of second capacitor 9 is set to be several hundreds volts and a chopper circuit or a DC/DC converter circuit is provided between second capacitor 9 and gate drive circuit 10, and a power source having a ten and a few volts is supplied, which is suitable for a power source voltage of gate drive circuit 10.

In this embodiment, a DC/DC converter circuit 17 is further provided between second capacitor 9 and gate drive circuit 10 in the embodiment of FIG. 1. Other construction of this embodiment is the same as that of the first embodiment, except that the voltage of second capacitor 9 in this embodiment is set to be larger than that in the first embodiment.

In FIG. 7, DC/DC converter circuit 17 is constructed with a control circuit 18, transistors 19a and 19b, a transformer 20, rectifiers 21a and 21b and capacitors 22a and 22b. The voltage of second capacitor 9 is supplied to control circuit 18 as an input voltage for DC/DC converter circuit 17. Transistors 19a and 19b are driven by control circuit 18 and are alternately switched such that when transistor 19a is ON transistor 19b is OFF, and when transistor 19b is ON, transistor 19a is OFF, and supply an AC voltage to a primary winding of transformer 20. Transformer 20 transforms the AC voltage at the primary winding into two AC voltages at the secondary windings. The voltages appearing at secondary windings of transformer 20 are converted by rectifiers 21a and 21b to DC voltages, which are smoothed by capacitors 22a and 22b and are supplied to gate drive circuit 10 as two isolated DC power sources suitable for gate drive circuit 10, respectively.

Control circuit 18 is provided with a function which monitors the output voltages of DC/DC converter circuit 17 and controls the ratio of ON and OFF times of respective transistors 19a and 19b so as to keep constantly the output voltages to be predetermined values.

Apart from the above-described embodiments, this fourth embodiment supplies two DC voltages to gate drive circuit 10. In the case of a GTO out of many types of switching devices, gate drive circuit 10 requires two power sources generating positive and negative voltages so as to drive the gate in the positive and negative directions to the cathode on turning ON and OFF GTO 1, respectively. The fourth embodiment is suitable for such applications.

By providing DC/DC converter circuit 17 in the gate power supply circuit, this embodiment have further effect that the capability to cope with the abnormalities in the power converter can be raised. Hereinafter, the reason for this will be described.

In this invention, the DC apportioned voltage of a switching device stored in second capacitor 9 is used for a main power source for gate drive circuit 10. In case that the DC bus voltage of the power converter is lost due to a fault and so on, the gate power is to be supplied only from the energy stored in second capacitor 9 till the fault is restored or the operation of the power converter is to be stopped. In case of such abnormalities, the voltage of second capacitor 9 will become greatly lower than that in the normal state. In case that the voltage of second capacitor 9 is directly supplied to gate drive circuit 10, the voltage of second capacitor 9 falls largely so that gate drive circuit 10 may operate abnormally. In this embodiment, however, DC/DC converter circuit 17 controls the ratio of ON and OFF times of transistors 19a and 19b so as to keep the output voltage thereof to be constant, as described above. Therefore, as long as the power is supplied from second capacitor 9 to gate drive circuit 10 through DC/DC converter circuit 17, it is possible to keep the output voltage of DC/DC converter circuit 17 for an appropriate time to a voltage level comparable to the voltage in the normal state even in the case that the voltage of second capacitor 9 falls greatly. As described above, in this embodiment, the capability to cope with the abnormalities in the power converter will be raised due to the function of DC/DC converter circuit 17 to control the output voltage thereof.

In the fourth embodiment, DC/DC converter circuit 17 is provided between second capacitor 9 and gate drive circuit 10. But this invention is not limited to this embodiment. A chopper circuit and so on can be used instead of DC/DC converter circuit 17 in another embodiment of this invention, so long as these circuits are provided with the same DC voltage conversion function as DC/DC converter circuit 17. It goes without saying that the another embodiment can achieve the same effect as the above-described fourth embodiment.

The voltage of second capacitor 9 is kept to a constant value as the average, so long as the power supplied from first capacitor 6 and the power consumed in gate drive circuit 10 are balanced. Actually, however, the power supplied from first capacitor 6 varies according to the variations of DC apportioned voltage of a switching device, differences in constants of parts, elements and devices constituting the circuit and factors due to secular changes thereof. The power consumed by gate drive circuit 10 also varies by many causes. The power supplied from first capacitor 6 is, therefore, set, with some margin, to a value larger than the power consumed in gate drive circuit 10, taking various variation factors into consideration. The reason is: if the power supplied from first capacitor 6 is insufficient for the required power, the voltage of second capacitor 9 continues to decrease, with the result that gate drive circuit 10 malfunctions finally. For this reason, the power supplied from first capacitor 6 is set to a value, as the average, larger than the power consumed in gate drive circuit 10. As a result, the voltage of second capacitor 9 will rise gradually and finally deviates from the range suitable for the power source voltage for gate drive circuit 10.

A fifth embodiment of this invention shown in FIG. 8 is provided to prevent the overvoltage of second capacitor 9. In FIG. 8, an overvoltage prevention circuit, such as a series circuit of a resistor 23 and a semiconductor switching device 24, such as a transistor, is connected in parallel with second capacitor 9 in the first embodiment of this invention shown in FIG. 1. In FIG. 8, a voltage of second capacitor 9 is detected by a voltage detector (not shown). When the detected voltage is over a predetermined value, switching device 24 is turned ON.

The operation of the fifth embodiment shown in FIG. 8 will be described. When the voltage of second capacitor 9 becomes an overvoltage, semiconductor switching device 24 is turned ON. Then, the energy stored in second capacitor 9 is consumed by resistor 23 and the voltage of second capacitor 9 drops, with the result that the over voltage of second capacitor 9 is prevented.

As described above, this invention provides a power source for gate drive circuit 10, such that a capacitor is charged to the DC apportioned voltage GTO 1, the high voltage static energy stored in the capacitor is converted to an energy of a low voltage by the switching of GTO 1 itself and the energy of the low voltage is supplied to gate drive circuit 10. Therefore, in the above described embodiments, the voltage of second capacitor 9 is very low till GTO 1 starts its switching operation. In case that a voltage of a certain level is required for an input voltage of gate drive circuit 10 before starting switching operation of GTO 1, a sixth embodiment of this invention shown in FIG. 9 is preferable.

Figure 9:
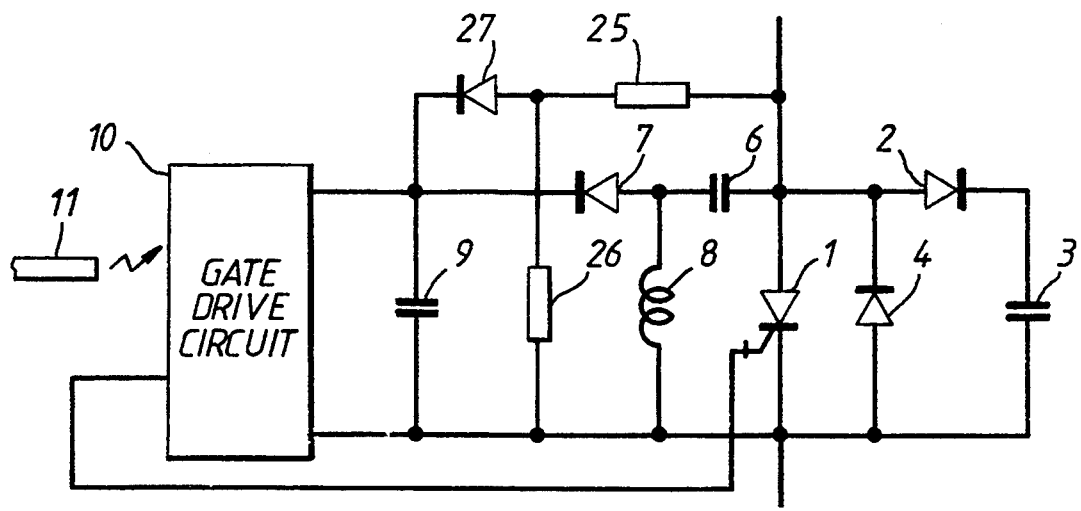
FIG. 9 is a layout diagram showing a gate power supply circuit according to a sixth embodiment of this invention.

In the embodiment shown in FIG. 9, a voltage divider circuit and a third diode 27 are further provided, and DC balance resistor 5 is omitted in the first embodiment of this invention shown in FIG. 1. In FIG. 9, the voltage divider circuit is constructed with a series circuit of resistors 25 and 26 and connected in parallel with the anode and cathode of GTO 1. The anode of third diode 27 is connected to a connection point of resistors 25 and 26 (voltage division point) of the voltage divider circuit, and the cathode of third diode 27 is connected to a connection point of second capacitor 9 and the cathode of first diode 7.

In the sixth embodiment constructed as described above, when a voltage is applied to DC bus of the power converter, the same voltage is then applied to the voltage divider circuit consisting of resistors 25 and 26, with the result that second capacitor 9 is charged to a voltage of a certain level through resistor 25 and diode 27 at the initial state. Third diode 27 is provided so that the power of second capacitor 9 is not consumed by resitor 25 when GTO 1 is ON. As the value of the resistance of resistor 25 is so high that third diode 27 may be omitted. In this case, the connection point of resistors 25 and 26 is directly connected to the connection point of second capacitor 9 and first diode 7.

DC balance resistor 5 connected in parallel with GTO 1 in the embodiment of FIG. 1 is not provided in the sixth embodiment of FIG. 9. This is because resistors 25 and 26 also operate both as DC balance resistor 5 and the voltage divider circuit. It may be also possible to provide DC balance resistor 5 separately from resistor 25 and 26. But, considering that reducing the number of parts for constructing the circuit is advantageous in terms of space and cost and it will also improve the reliability of the circuit, it is clearly more advantageous that DC balance resistor 5 is omitted in the sixth embodiment.

Figure 10:
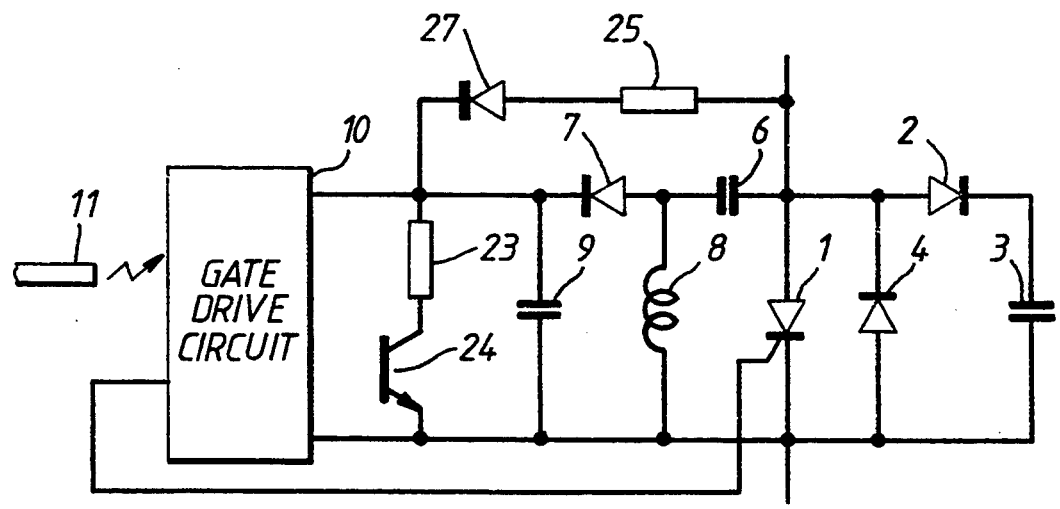
FIG. 10 is a layout diagram showing a gate power supply circuit according to a seventh embodiment of this invention.

FIG. 10 is a layout diagram showing a gate power supply circuit according to a seventh embodiment of this invention. This embodiment is a combination of the fifth embodiment shown in FIG. 8 and the sixth embodiment shown in FIG. 9. In this embodiment, resistor 26 of the voltage divider circuit can be omitted. This embodiment has the effect of the fifth embodiment of FIG. 8 along with the effect of the sixth embodiemnt of FIG. 9. In this embodiment, third diode 27 may be omitted as described in the sixth embodiment. In this case, resistor 25 is connected directly in parallel with a series circuit of first capacitor 6 and first diode 7.

Figure 11:
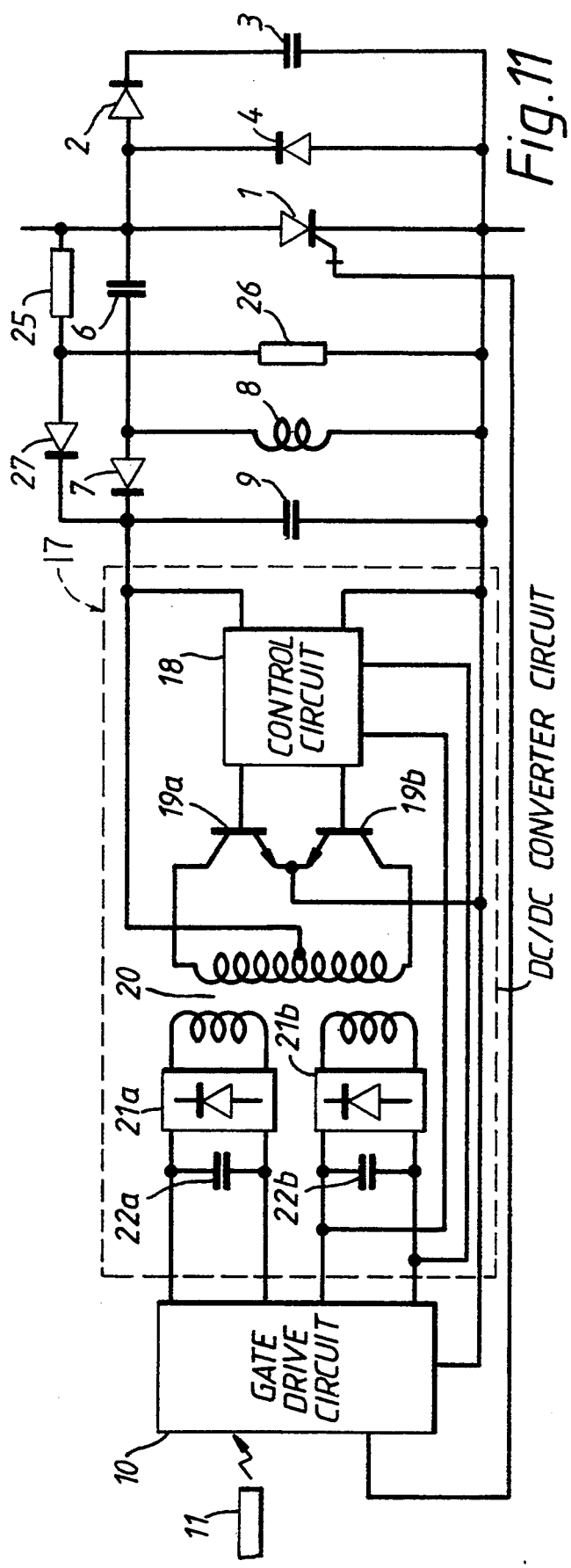
FIG. 11 is a layout diagram showing a gate power supply circuit according to an eighth embodiment of this invention.

FIG. 11 is a layout diagram showing a gate power supply circuit according to an eighth embodiment of this invention. This embodiment is a combination of the fourth embodiment shown in FIG. 7 and the sixth embodiment shown in FIG. 9. This embodiment has the effect of the fourth embodiment of FIG. 7 along with the effect of the sixth embodiment of FIG. 9.

It should be noted that, although in the above explanation, examples using GTOs as switching devices have been described, this invention is not restricted to GTOs as switching devices and could be employed with other self-turn-off devices.

Furthermore, although in the above description the switching device is taken as being a GTO 1 so 10 is its gate drive circuit, transistors or the like could also be employed as switching devices. The gate drive circuit, therefore, includes the circuits to which this invention could be applied, for example, fault detection circuits with switching devices attached, or control and protection circuits etc. for high potential units. In this invention, these are designated by the general term "gate drive circuit or the like".

Yet further, although this invention is entitled "Gate power supply circuit", as mentioned above, this invention can also be applied to the case where transistors or the like are employed as switching devices, so the term "gate power supply circuit" is intended to include circuitry whereby switching devices such as transistors are controlled.

As described above, with the gate power supply circuit according to this invention, energy is obtained from the main circuit side utilizing the switching action of the switching device located in the main circuit, such that the energy stored in the first capacitor when the switching device is OFF is transferred to the second capacitor through the inductor when the switching device is ON, thereby enabling the energy stored in this second capacitor to be utilized; the large number of isolating transformers of high withstand voltage that were necessary in the prior art are thereby made unnecessary, enabling miniaturization and cost reduction of-a power converter constructed using self-turn-off devices.

Obviously, numerous modifications and variations of the present invention are possible in light of the above teachings. It is therefore to be understood that within the scope of the appended claims, the invention may be practiced otherwise than as specifically described herein.

What is claimed is:

1. A gate power supply circuit,, comprising:
   a switching device;
   gate drive circuit means connected to said switching device for generating a gate signal to be supplied to a gate of said switching device;
   a first series circuit of a first capacitor and an inductor, connected in parallel with said switching device; and
   a second series circuit of a first diode and a second capacitor, connected in parallel with said inductor;
   said gate drive circuit means being connected to said second capacitor to receive energy stored in said second capacitor as power source for said gate drive circuit means.

2. The gate power supply circuit according to claim 1, wherein:
   said first series circuit further includes a second diode connected in series with said first capacitor and said inductor; and
   said second series circuit is connected in parallel with a series circuit of said inductor and said second diode.

3. The gate power supply circuit according to claim 1, further comprising:
   a third capacitor connected in parallel with said inductor.

4. The gate power supply circuit according to claim 1, further comprising:
   DC voltage conversion circuit means connected between said second capacitor and said gate drive circuit means for converting a high DC voltage of said second capacitor into a low DC voltage;
   said low DC voltage being supplied to said gate drive circuit means as said power source thereof.

5. The gate power supply circuit according to claim 4, wherein:
   said DC voltage conversion circuit means includes a chopper circuit.

6. The gate power supply circuit according to claim 4, wherein:
   said DC voltage conversion circuit means includes a DC/DC converter circuit.

7. The gate power supply circuit according to claim 6, wherein:
   said DC/DC converter circuit outputs a positive DC voltage and a negative DC voltage to said gate drive circuit means as said low DC voltage.

8. The gate power supply circuit according to claim 1, further comprising:
   an overvoltage prevention circuit connected to said second capacitor for preventing an overvoltage of said second capacitor.

9. The gate power supply circuit according to claim 8, wherein:
   said overvoltage prevention circuit includes a third series circuit of a resistor and a semiconductor switch, connected in parallel with said second capacitor; and
   said semiconductor switch is turned ON when a voltage of said second capacitor becomes over a predetermined voltage.

10. The gate power supply circuit according to claim 1, further comprising:
    a resistor; and
    wherein said resistor is connected in series with said second capacitor to form a series circuit; and
    said series circuit is connected in parallel with said switching device;
    whereby said second capacitor is charged through said resistor before said switching device starts switching operation.

11. The gate power supply circuit according to claim 1, further comprising:
    a fourth series circuit of a resistor and a third diode; and
    wherein said fourth series circuit is connected in series with said second capacitor to form a fifth series circuit; and
    said fifth series circuit is connected in parallel with said switching device such that said third diode is connected in the same direction as said switching device;
    whereby said second capacitor is charged through said resistor and said third diode before said switching device starts switching operation.

* * * * *